(12) United States Patent
West (10) Patent No.: US 9,461,023 B2
(45) Date of Patent: Oct. 4, 2016

(54) JETTING A HIGHLY REFLECTIVE LAYER ONTO AN LED ASSEMBLY

(75) Inventor: R. Scott West, Pleasanton, CA (US)

(73) Assignee: Bridgelux, Inc., Livermore, CA (US)

( * ) Notice: Subject to any disclaimer, the term of this patent is extended or adjusted under 35 U.S.C. 154(b) by 669 days.

(21) Appl. No.: 13/284,835

(22) Filed: Oct. 28, 2011

(65) Prior Publication Data

US 2013/0105837 A1 May 2, 2013

(51) Int. Cl.
*H01L 25/075* (2006.01)
*H01L 33/60* (2010.01)
*H01L 33/46* (2010.01)

(52) U.S. Cl.
CPC ........... *H01L 25/0753* (2013.01); *H01L 33/46* (2013.01); *H01L 33/60* (2013.01); *H01L 2224/32225* (2013.01); *H01L 2224/45144* (2013.01); *H01L 2224/48137* (2013.01); *H01L 2224/48227* (2013.01); *H01L 2224/73265* (2013.01); *H01L 2224/8592* (2013.01); *H01L 2933/0025* (2013.01)

(58) Field of Classification Search
CPC .............. H01L 2224/48091; H01L 2924/00; H01L 2224/45144; H01L 25/0753; H01L 2224/48137; H01L 2924/00014; H01L 2924/0781
USPC .......................................................... 438/29
See application file for complete search history.

(56) References Cited

U.S. PATENT DOCUMENTS

| 7,511,298 | B2 | 3/2009 | Kawaraya et al. ............. 257/43 |
| 2005/0019203 | A1* | 1/2005 | Saitoh et al. ................. 420/506 |
| 2006/0138441 | A1 | 6/2006 | Kromotis et al. .............. 257/99 |
| 2006/0284190 | A1* | 12/2006 | Zimmerman et al. .......... 257/79 |
| 2007/0020789 | A1 | 1/2007 | Lee et al. ........................ 438/22 |
| 2007/0087130 | A1* | 4/2007 | Arai .............................. 427/457 |

(Continued)

FOREIGN PATENT DOCUMENTS

| JP | 2004-5562 | 2/2004 |
| JP | 2006-190764 | 7/2006 |

(Continued)

OTHER PUBLICATIONS

International Search Report and Written Opinion by the Korean Intellectual Property Office (KIPO) as international searching authority (ISA) in the related international application PCT/US12/061571 dated Mar. 28, 2013 (14 pages).

(Continued)

*Primary Examiner* — Tony Tran
(74) *Attorney, Agent, or Firm* — Imperium Patent Works; T. Lester Wallace; Darien K. Wallace (57) ABSTRACT

A layer of Highly Reflective (HR) material is deposited by jetting microdots of the HR material in liquid form onto a substrate and then allowing the HR material to harden. In one example, the HR layer is the HR layer of a white LED assembly. The HR layer is jetted onto the substrate around LED dice of the assembly after die attach and wire bonding have been completed. The HR material can be made to flow laterally so that areas of the substrate under wire bonds are coated with HR material, so that HR material contacts side edges of the LED dice, and so that HR material contacts the inside side edge of a retaining ring. By jetting the HR material in this way, the amount of substrate that is not covered with HR material is reduced, thereby improving the light efficiency of the resulting LED assembly.

19 Claims, 9 Drawing Sheets

SIMPLIFIED CROSS-SECTIONAL SIDE VIEW OF THE WHITE LED ASSEMBLY

(56) References Cited

U.S. PATENT DOCUMENTS

| | | | |
|---|---|---|---|
| 2007/0272930 A1 | 11/2007 | Tseng et al. | 257/79 |
| 2009/0050907 A1 | 2/2009 | Yuan et al. | 257/88 |
| 2009/0050908 A1 | 2/2009 | Yuan et al. | 257/88 |
| 2009/0170225 A1 | 7/2009 | Oka et al. | 438/22 |
| 2009/0212316 A1 | 8/2009 | Braune et al. | 257/99 |
| 2009/0227050 A1 | 9/2009 | Shin et al. | 438/27 |
| 2010/0238511 A1* | 9/2010 | Neese | 358/3.23 |
| 2010/0244080 A1 | 9/2010 | Kim | 257/98 |
| 2011/0012143 A1 | 1/2011 | Yuan et al. | 257/91 |
| 2011/0043106 A1* | 2/2011 | Higashikawa et al. | 313/582 |
| 2011/0149577 A1 | 6/2011 | Shida et al. | 362/294 |
| 2011/0198655 A1 | 8/2011 | De Graaf et al. | 257/98 |
| 2012/0187430 A1 | 7/2012 | West et al. | 257/88 |
| 2012/0193647 A1* | 8/2012 | Andrews | 257/88 |
| 2013/0027931 A1* | 1/2013 | Isogai et al. | 362/235 |

FOREIGN PATENT DOCUMENTS

| | | |
|---|---|---|
| JP | 2011-108748 | 6/2011 |
| JP | 2011-187451 | 9/2011 |
| WO | WO2004/033756 | 4/2004 |
| WO | WO2010/102910 | 9/2010 |

OTHER PUBLICATIONS

International Search Report and Written Opinion by the Korean Intellectual Property Office (KIPO) as international searching authority (ISA) in the related international application PCT/US13/023261 dated Mar. 28, 2013 (25 pages).

Asymtek Axiom X-1000 Series Dispensing System Operations Manual., p. 3-36 Figure 3-22 Dual Action Dispensing Head (2009) (1 page).

Office action of Taiwanese Patent Office dated Dec. 4, 2015 in related Taiwanese application 101138597 (10 pages).

Extended European Search Report (EESR) dated Sep. 2, 2015 from the European Patent Office in the related European application 13743337.1 (9 pages).

* cited by examiner

TOP-DOWN VIEW OF WHITE LED ASSEMBLY (PRIOR ART)

FIG. 1

SIMPLIFIED CROSS-SECTIONAL SIDE VIEW OF THE WHITE LED ASSEMBLY

(PRIOR ART)

FIG. 2

PANEL OF METAL CORE PRINTED
CIRCUIT BOARDS
(PRIOR ART)

FIG. 3

TOP-DOWN VIEW OF DIE
PLACEMENT AREA BEFORE HR
DEPOSITION
(PRIOR ART)

FIG. 4

SCREEN PRINTING MASK
(PRIOR ART)

FIG. 5

TOP-DOWN VIEW OF DIE
PLACEMENT AREA AFTER HR
DEPOSITION
(PRIOR ART)

FIG. 6

TOP-DOWN VIEW OF DIE PLACEMENT
AREA AFTER DIE ATTACH
(PRIOR ART)

FIG. 7

TOP-DOWN VIEW OF DIE PLACEMENT
AREA AFTER WIRE BONDING
(PRIOR ART)

FIG. 8

TOP-DOWN VIEW OF DIE
PLACEMENT AREA AFTER
FORMATION OF RETAINING RING
(PRIOR ART)

FIG. 9

TOP-DOWN VIEW AFTER
PLACEMENT OF PHOSPHOR
(PRIOR ART)

FIG. 10

TOP-DOWN VIEW OF A WHITE LED ASSEMBLY

FIG. 11

SIMPLIFIED CROSS-SECTIONAL SIDE VIEW OF THE WHITE LED ASSEMBLY

FIG. 12

PANEL OF METAL CORE PRINTED
CIRCUIT BOARDS

FIG. 13

TOP-DOWN VIEW OF DIE
PLACEMENT AREA BEFORE DIE
PLACEMENT

FIG. 14

TOP-DOWN VIEW OF DIE
PLACEMENT AREA AFTER DIE
PLACEMENT

FIG. 15

TOP-DOWN VIEW OF DIE
PLACEMENT AREA AFTER WIRE
BONDING

FIG. 16

TOP-DOWN VIEW OF DIE PLACEMENT AREA
AFTER FORMATION OF THE RETAINING RING

FIG. 17

JETTING MICRODOTS OF HR MATERIAL

FIG. 18

TOP-DOWN VIEW OF DIE
PLACEMENT AREA AFTER JETTING
OF HR MATERIAL

FIG. 19

TOP-DOWN VIEW OF DIE
PLACEMENT AREA AFTER
PLACEMENT OF PHOSPHOR

FIG. 20

WHITE LED ASSEMBLY HAVING LED DICE
DISPOSED IN A WELL

JETTING A HIGHLY REFLECTIVE LAYER ONTO AN LED ASSEMBLY

TECHNICAL FIELD

The present disclosure relates generally to Light Emitting Diode (LED) devices and assemblies and related methods.

BACKGROUND INFORMATION

Figure 1:
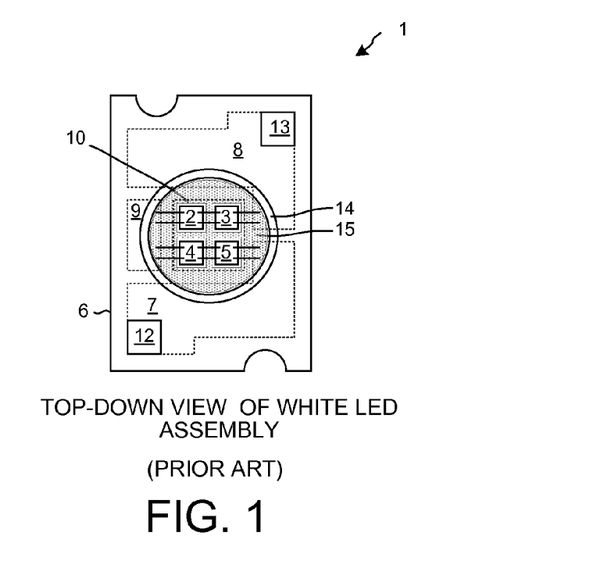
FIG. 1 (Prior Art) is top-down diagram of one type of conventional LED assembly.

There are many different types of Light Emitting Diode (LED) assemblies. FIG. 1 (Prior Art) is a top-down diagram of one such LED assembly 1. LED assembly 1 includes four laterally-contacted LED dices 2-5 that are mounted on a metal core substrate 6. Substrate 6 in this case is a Metal Core Printed Circuit Board (MCPCB). Areas 7-10 illustrated in dashed lines represent portions of a metal layer that is disposed underneath a solder mask layer 11 (see FIG. 2). Reference numeral 12 identifies a portion of metal portion 7 that is exposed through a first opening in the solder mask layer 11. Similarly, reference numeral 13 identifies a portion of metal portion 8 that is exposed through a second opening in solder mask layer 11. These exposed portions 12 and 13 serve as bond pads. Ring structure 14 is a retaining ring of silicone. An amount of a material often referred to as phosphor 15 is disposed within the ring structure 14 over the LED dice. This phosphor actually comprises silicone and particles of phosphor that area embedded in the silicone.

Figure 2:
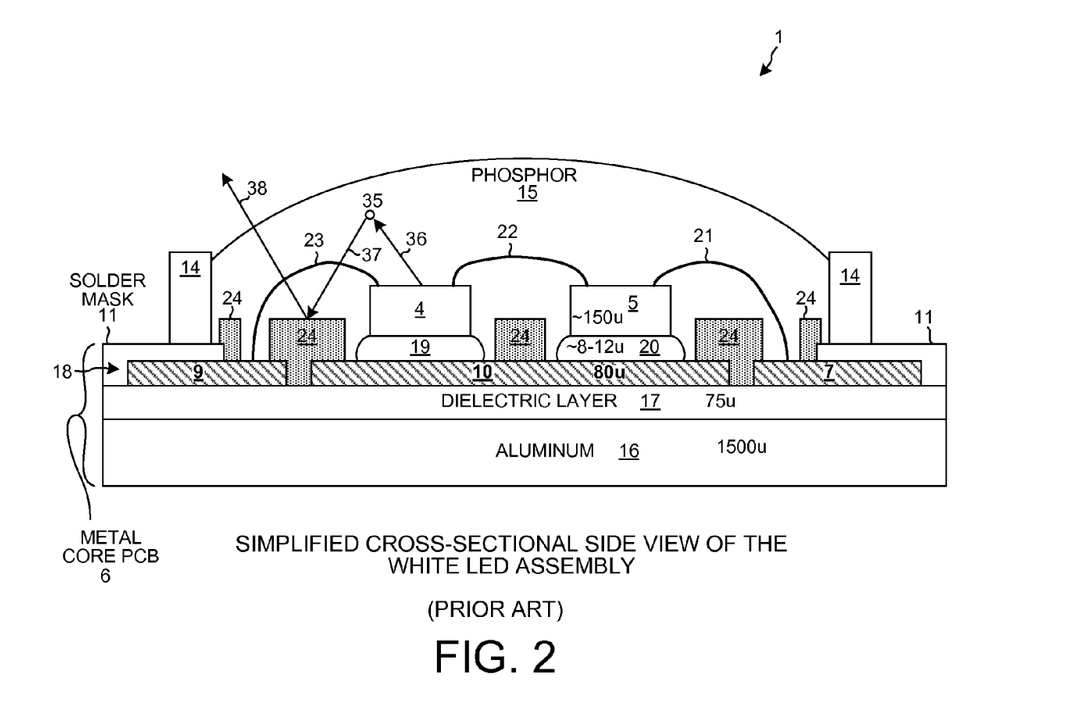
FIG. 2 (Prior Art) is a simplified cross-sectional side view of the LED assembly of FIG. 1.

FIG. 2 (Prior Art) is a simplified cross-sectional diagram of LED assembly 1 of FIG. 1. MCPCB 6 includes an aluminum layer 16, a global dielectric layer 17, a layer 18 of metallization of which metal portions 7-10 are parts, and solder mask layer 11. Layer 18 of metal may involve multiple sublayers of metal including an upper layer of a very reflective metal such as silver. Metal portion 10 is a square pad of metal upon which the LED dice 2-5 are mounted. The LED dice 2-5 are fixed to pad 10 by associated amounts of silver epoxy. Amount 19 of silver epoxy is shown fixing LED die 4 to pad 10. Amount 20 of silver epoxy is shown fixing LED die 5 of pad 10. Reference numerals 21-23 identify wire bonds.

A layer 24 of a Highly Reflective (HR) material is disposed within ring 14 between and around the dice 2-5 and wire bonds 21-23 as illustrated. The diagram is simplified in that the regions of the HR material have smooth and rounded edges. Some of the light emitted by LED dice 2-5 may be absorbed by phosphor particles in phosphor 15. These particles may then fluoresce and re-emit light such that this light is directed downward, rather than upward as is desired. Reference numeral 35 identifies one such particle of phosphor. A light ray 36 is emitted from the top of LED die 4 and travels up and is absorbed by particle 35. A second light ray 37 is then emitted from particle 35 and this second light ray travels back downward as shown. HR material 24 is provided so that this light ray will be reflected so that it can pass upward and out of the assembly as light ray 38. Particle 35 is but one such particle. There are numerous particles dispersed throughout the silicone material of phosphor 15. Light emitted from the LED dice 2-5 can be emitted in various different directions including out of the sides of the LED dice. Similarly, a light ray emitted from a phosphor particle can travel away from the particle any direction. The illustration of particle 35, of the direction of light emission from particle 35, and of the associated light rays 36, 37 and 38 in FIG. 2 are only representative of one such particle and its associated light rays. An example of an HR material is a silicone material that is commercially available from ShinEtsu Chemical Co. Ltd. of Tokyo, Japan.

Figure 3:
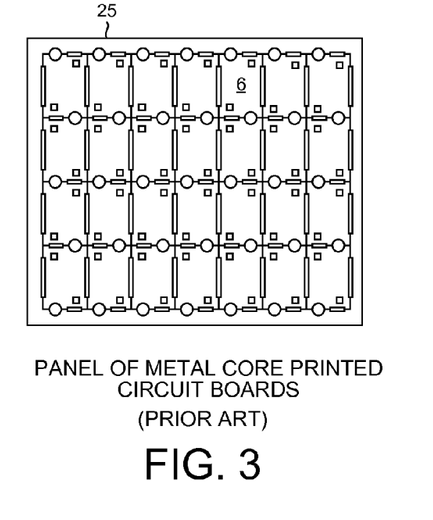
FIG. 3 (Prior Art) is a top-down diagram of a panel of MCPCBs, including MCPCB 6.
Figure 4:
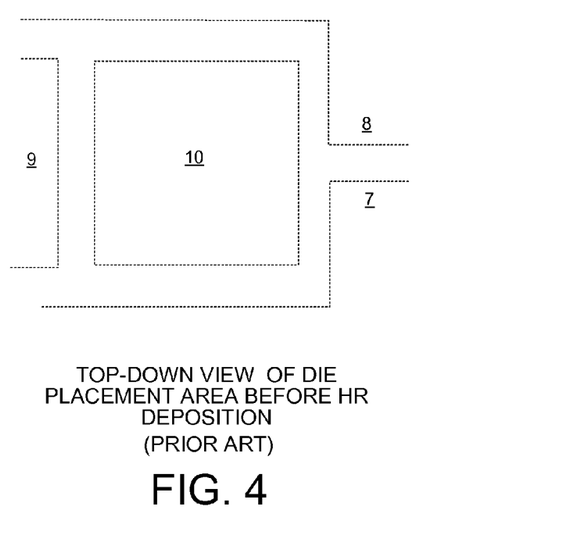
FIG. 4 (Prior Art) is a top-down diagram of the die placement area of MCPCB 6 before die placement.
Figure 5:
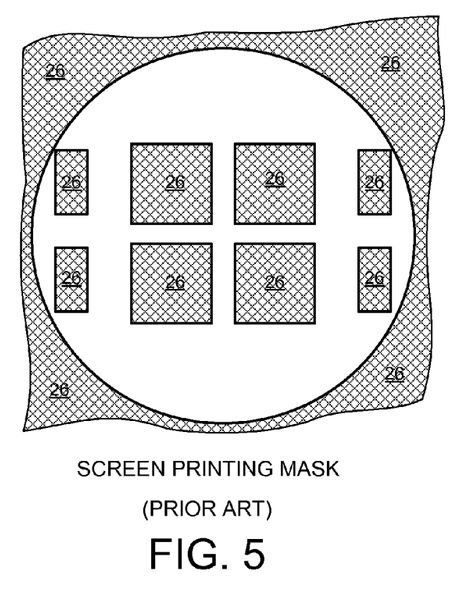
FIG. 5 (Prior Art) is a diagram of a screen printing mask used to apply a Highly Reflective (HR) material onto the die placement area of FIG. 4.
Figure 6:
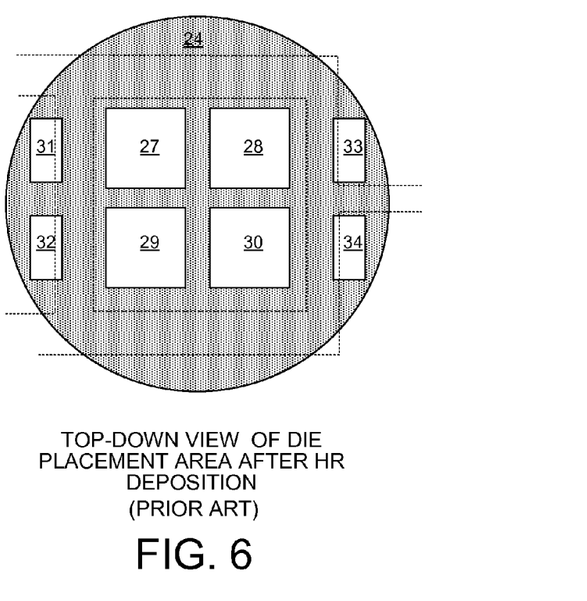
FIG. 6 (Prior Art) is a top-down diagram of the die placement area of FIG. 4 after deposition of the HR material.
Figure 7:
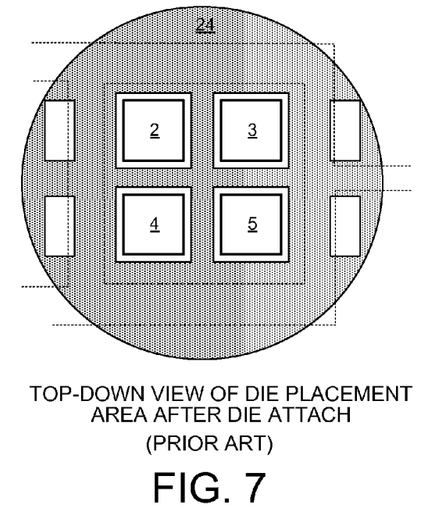
FIG. 7 (Prior Art) is a top-down diagram of the die placement area of FIG. 6 after die attach has been completed.
Figure 8:
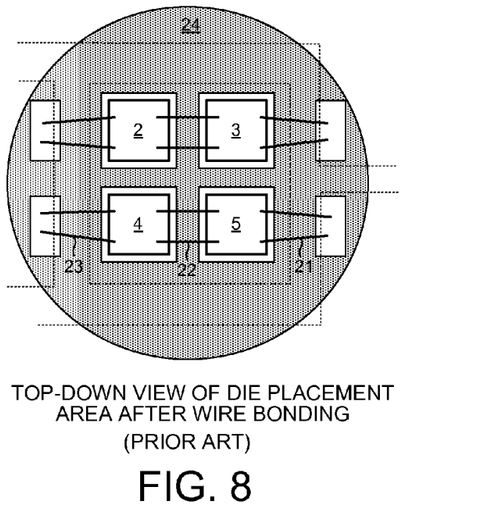
FIG. 8 (Prior Art) is a top-down diagram of the die placement area of FIG. 7 after wire bonding has been completed.
Figure 9:
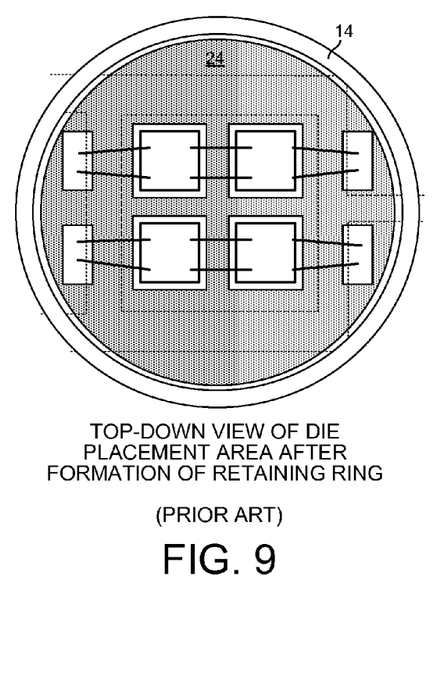
FIG. 9 (Prior Art) is a top-down diagram of the die placement area of FIG. 8 after formation of a phosphor retaining ring.
Figure 10:
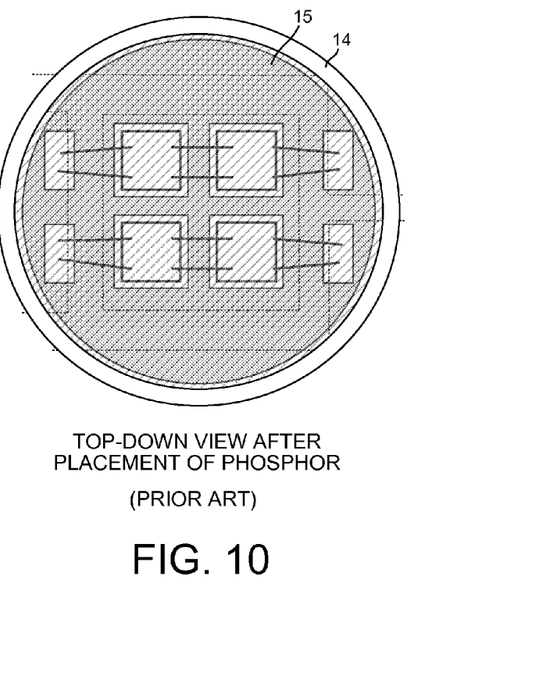
FIG. 10 (Prior Art) is a top-down diagram of the die placement area of FIG. 9 after placement of phosphor within the retaining ring.

FIGS. 3-10 (Prior Art) illustrate a prior art method of manufacturing the LED assembly 1 of FIG. 1. FIG. 3 (Prior Art) is a top-down diagram of a panel 25 of MCPCBs. MCPCB 6 is one of the MCPCBs of the panel. FIG. 4 (Prior Art) is a top-down diagram of the pad portion 10 of the MCPCB portion 6 of panel 25. This pad portion 10 is exposed through an opening in the solder mask layer 11. FIG. 5 (Prior Art) is an illustration of a screen printing mask 26 used in the next step of forming the layer 24 of Highly Reflective (HR) material. FIG. 6 (Prior Art) is a diagram that shows the result of using the screen printing mask 26 of FIG. 5 to deposit the HR layer 24 onto panel 25. HR material of layer 24 is deposited in the shaded circular region. This circular region is in the center of MCPCB 6. As illustrated, there are eight windows 27-34 in the circular HR layer 24. FIG. 7 (Prior Art) is a diagram that shows the result of a next die attach step. Each of the four dice 2-5 is attached by an amount of silver epoxy in a corresponding one of the four center windows 27-30 in the HR layer 24. Each of the openings 27-30 in the HR layer is slightly larger than its associated die in order to accommodate variations in physical dimensions and inaccuracies of the placement of the dice and wire bonds. FIG. 8 (Prior Art) is a diagram that shows the result of a next step of attaching wire bonds. Only three of the wire bonds 21-23 are identified in the diagram with reference numerals. Some of the wire bonds extend between dice. Others of the wire bonds extend from a die to a conductive upper layer of the substrate. FIG. 9 (Prior Art) shows the result of a next step of forming retaining ring 14. Retaining ring 14 is formed so that it encircles the circular layer 24 of HR material as illustrated. FIG. 10 (Prior Art) shows the result of a next step of placing the phosphor 15 over the LED dice 2-5 in the area bounded by retaining ring 14. After the phosphor 15 has cured, the panel 25 is singulated to form multiple LED assemblies of which LED assembly 1 is one.

SUMMARY

After any die attach and wire bonding steps in the manufacturing of an array-based LED assembly, a layer of Highly Reflective (HR) material is deposited around the LED dice to coat the upper surface of the substrate. In one example, the HR material is deposited with precision by jetting microdots of the HR material in liquid form onto selected portions of the upper surface of the substrate, thereby forming a layer of HR material that is thick enough (at least 10 microns thick) to have a reflectivity of at least 85 percent.

Limits on mechanical tolerances can lead to physical differences between LED assemblies being manufactured. LED dice may differ slightly in size, and LED dice may be placed in slightly different locations from one LED assembly to the next. In accordance with one novel aspect, machine imaging is usable to detect such physical differences from LED assembly to LED assembly and to control the jetting process to adjust for such physical differences so that in each LED assembly being manufactured substantially all of the upper substrate surface that is not covered with an LED die is coated with HR material.

In one example, each microdot of HR material has a diameter of less than 100 microns and is typically 50-80 microns in diameter. The HR material has an adequately low viscosity (less than 1100 cP) that once reaching the substrate surface the HR material flows laterally to some degree. Due to the lateral flow of the HR material, the HR material can be made to flow under bridging wire bonds and to coat the substrate underneath the wire bonds. Due to this lateral flow, the HR material flows can be made to flow laterally and to reach and to wet side edges of the LED dice. Due to this lateral flow, the HR material can be made to flow laterally and to reach and to wet the inside side edge of a phosphor retaining ring. In one example, the area of substrate between LED dice is not coated with HR material in order to reduce manufacturing time. Because the HR material is only deposited after die attach and after wire bonding, fiducial markers on the upper surface of the substrate (that would otherwise be covered and obscured by HR material were conventional screen printing used to deposit the HR material) are observable and usable during die attach and wire bonding. The depositing of the HR layer by jetting microdots of HR material results in a reduction in the amount of exposed substrate area that is not covered with HR material. Reducing the amount of exposed substrate area that is not covered with HR material serves to improve the light efficiency of the resulting LED assembly.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 11:
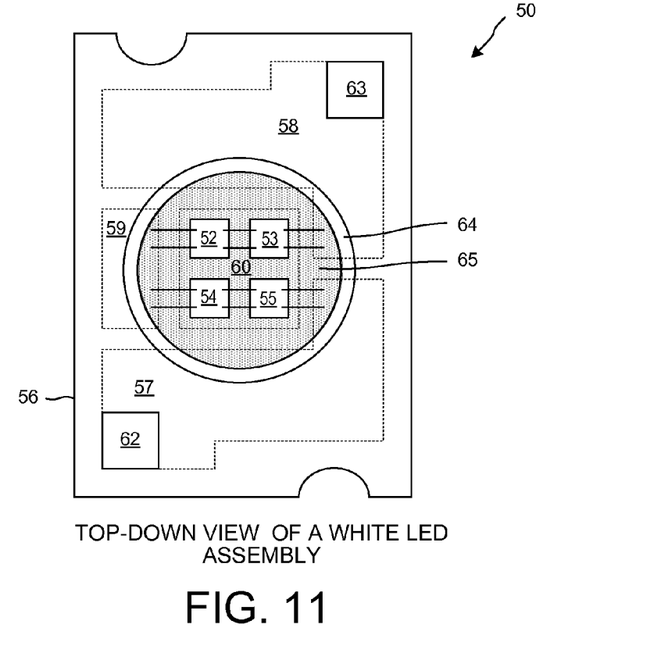
FIG. 11 is a top-down diagram of a white LED assembly in accordance with one novel aspect.

FIG. 11 is a simplified top-down diagram of a white Light Emitting Diode (LED) assembly 50 in accordance with one novel aspect. LED assembly 50 includes four laterally-contacted LED dice 52-55 that are mounted on a substrate 56. In the present example, the substrate is a Metal Core Printed Circuit Board (MCPCB). Areas 57-60 illustrated in dashed lines represent portions of a metal layer 68 that is disposed underneath a solder mask layer 61 (see FIG. 12). Reference numeral 62 identifies a portion of metal portion 57 that is exposed through a first opening in solder mask layer 61. Reference numeral 63 identifies a portion of metal portion 58 that is exposed through a second opening in solder mask layer 61. These exposed portions 62 and 63 serve as bond pads. Ring structure 64 is a retaining ring of silicone. An amount of phosphor 65 is disposed within the ring structure 64 over the LED dice. This phosphor actually comprises silicone and particles of phosphor that are embedded in the silicone.

Figure 12:
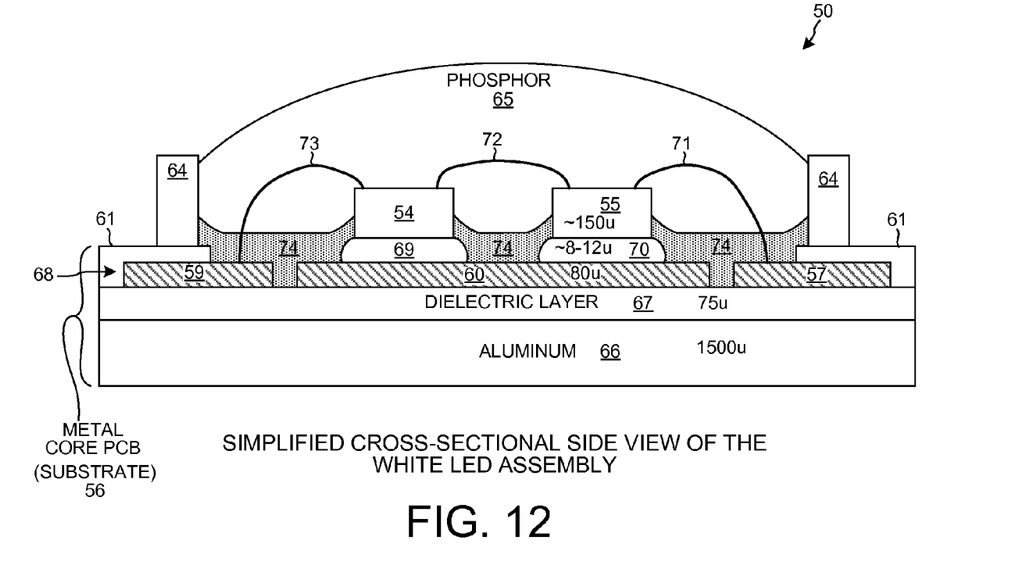
FIG. 12 is a simplified cross-sectional side view of the white LED assembly of FIG. 11.

FIG. 12 is a simplified cross-sectional side view of the LED assembly 50 of FIG. 11. MCPCB 56 includes an aluminum layer 66, a global dielectric layer 67, a layer 68 of metallization, and solder mask layer 61. Metal portions 57-60 are parts of layer 68. Layer 68 of metal involves multiple sublayers of metal including a lower layer of copper, a middle layer of nickel, and an upper layer of a very reflective metal such as silver. Metal portion 60 is a square pad of metal upon which the LED dice 52-55 are mounted. The LED dice are laterally-contacted blue LED devices whose epitaxial layers are fabricated on an insulative sapphire substrate. LED dice 52-55 are fixed to pad 60 by associated amounts of silver epoxy. Amount 69 of silver epoxy is shown fixing LED die 54 to pad 60. Amount 70 of silver epoxy is shown fixing LED die 55 of pad 60. Reference numerals 71-73 identify three of the wire bonds seen in top-down perspective in FIG. 11.

A layer 74 of a Highly Reflective (HR) material is disposed within ring 64 between and around the dice and the wire bonds as illustrated. In the example of FIG. 12, the layer 74 contacts the retaining ring 64 and also contacts the side edges of the LED dice 52-55.

FIGS. 13-20 illustrate a method of manufacturing the LED assembly 50 of FIG. 11.

Figure 13:
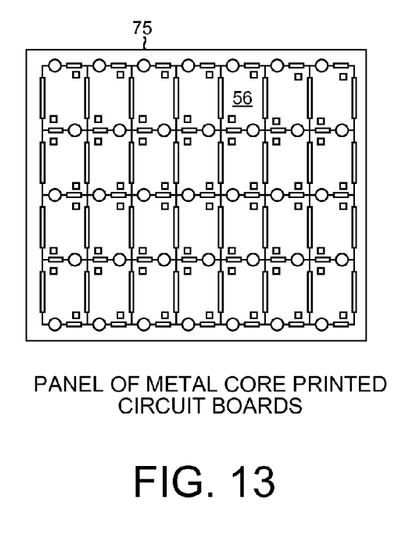
FIG. 13 is a top-down diagram of a panel of MCPCBs of which the MCPCB 56 of FIG. 12 is one.

FIG. 13 is a top-down diagram of a panel 75 of MCPCBs. MCPCB 56 is one of the MCPCBs of the panel.

Figure 14:
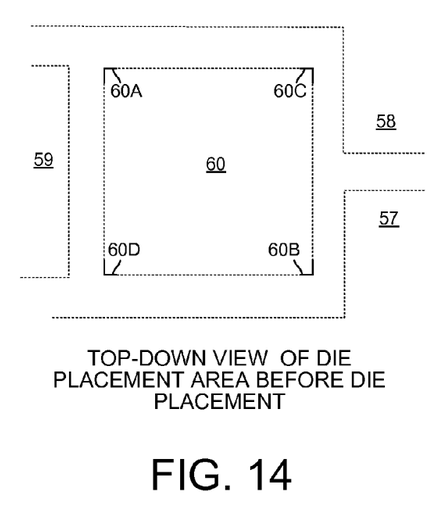
FIG. 14 is a top-down diagram of the die placement area of MCPCB 56.

FIG. 14 is a top-down diagram of the pad portion 60 of the MCPCB 56 of panel 75. This pad portion 60 is exposed through an opening in the solder mask layer 61. The metal surfaces of the panel are plasma cleaned. The corners 60A-60D serve as fiducial markers used in later assembly steps.

Figure 15:
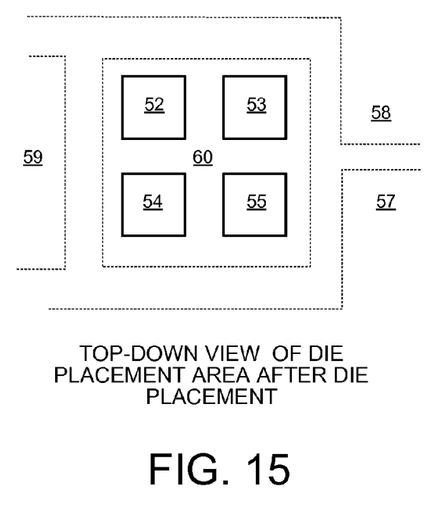
FIG. 15 is a top-down diagram of the placement area of FIG. 14 after die attach has been completed.

FIG. 15 shows the result of the next step of the method. LED dice 52-55 are placed and bonded to pad portion 60 as illustrated. Each die is bonded to pad portion 60 by an associated amount of silver epoxy. The bond line thickness (distance between the bottom of the die and the top of the substrate surface) is less than 12 microns, and it is typically about 8 microns.

Figure 16:
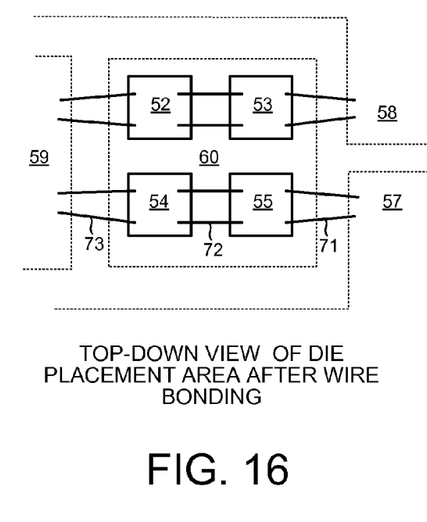
FIG. 16 is a top-down diagram of the placement area of FIG. 15 after wire bonding has been completed.

FIG. 16 shows the result of the next step of the method. Wire bonds are attached. Some of these wire bonds extend between dice. Others of the wire bonds extend from a die to a conductive upper layer of the substrate. Reference numerals 71-73 identify three of the wire bonds. The wire bonds may be sections of 1 mil diameter gold wire.

Figure 17:
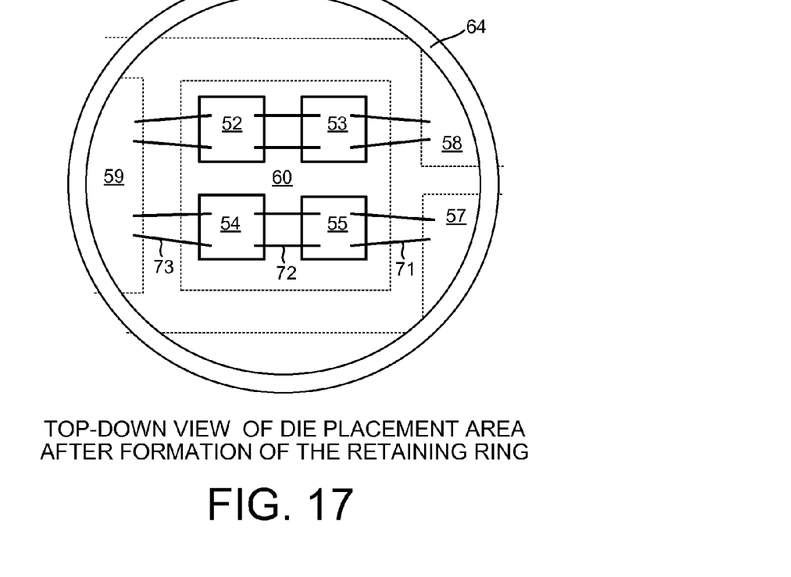
FIG. 17 is a top-down diagram of the placement area of FIG. 16 after formation of the phosphor retaining ring.

FIG. 17 shows the result of the next step of the method. Retaining ring 64 is formed on the structure as shown.

Figure 18:
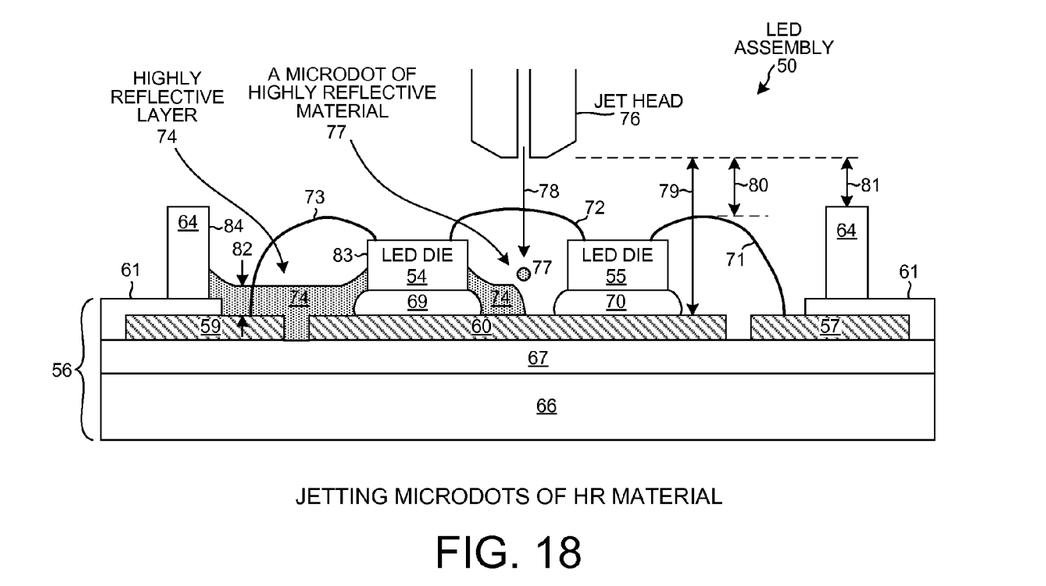
FIG. 18 is a simplified cross-sectional diagram that shows the deposition of an HR layer by jetting microdots of HR material onto the substrate around and between the LED dice of the LED assembly.

FIG. 18 illustrates a next step in the method in which layer 74 of HR material is deposited. In one example, layer 74 of HR material is deposited using a jetting process. Microdots of HR material are jetted out of a jet head 76 so that the microdots travel toward the substrate 56 (MCPCB) and impact the substrate, thereby effectively painting the surface of the substrate with HR material. The liquid HR material does not flow under the LED dice due to the silver epoxy bonding material occupying this space. The jet head 76 is moved across the surface of the assembly of FIG. 17 as microdots of HR material are shot at the substrate so that areas of the surface of the substrate around the dice, and between the dice, and within the confines of circular retaining ring 64 are painted with HR material, but such that the top surfaces of the dice and the top surfaces of the wire bonds are not painted. One of these microdots is identified with reference numeral 77 in FIG. 18. Arrow 78 indicates the path of its travel from jet head 76 toward the surface of the substrate. In one example, each microdot has a diameter of less than 100 microns and is typically 50-80 microns in diameter. The layer 74 is deposited to be at least 10 microns thick. Arrows 82 identify this thickness. In the illustrated example, layer 74 is 50 microns thick. The distance 80 between the bottom of the jet head 76 and the upper extent of the wire bonds is approximately 500 microns. In this example, the distance 79 between the bottom of the jet head 76 and the upper surface of metal layer 68 (including pad 60) is approximately 1000 microns. In this example, the distance 81 between the bottom of the jet head 76 and the upper surface of retaining ring 64 is approximately 500 microns.

The HR material being jetted is made to have a predetermined and controlled viscosity such that the liquid HR material will flow laterally somewhat across the surface being painted before the HR material cures and solidifies. Due to this flowing action, microdots of liquid HR material are fired onto the substrate surface near to a wire bond. The liquid HR material once on the substrate surface then flows laterally underneath the wire bond so that after the step of depositing the HR material is completed the HR layer 74 coats the surfaces of substrate 56 (MCPCB) that are directly underneath wire bonds. At an end of a wire bond where the wire bond contacts the substrate, the entire circular circumference of the wire is contacting HR material. Similarly, due to the predetermined viscosity of the liquid HR material, the HR material flows laterally such that it reaches and wets the side edges of the LED dice 52-55 as illustrated. Reference numeral 83 identifies a side edge of LED die 54. In this example, only the bottom sapphire portion of the side edge 83 is wetted. The upper epitaxial portion of the side edge 83 is not wetted. Similarly, the HR material is made to flow laterally and to wet the inside side edge of the retaining ring 64 as illustrated. Reference numeral 84 identifies the inside side edge of retaining ring 64. The HR material is deposited with such a thickness that once it has cured and solidified it has a reflectivity of at least 85 percent (for example, 94 percent).

In one example, the HR material is the material KER-2010-DAM or material KER-2020 that is commercially available from ShinEtsu Chemical Co. Ltd. of Tokyo, Japan. The HR material may comprise silicone and a titanium dioxide powder, where the titanium dioxide powder is suspended in the silicone. The HR material is made jettable by cutting it with a solvent. In one example, the solvent is an oil-based solvent such as dimethylformamide (DMF) commercially available from ShinEtsu as DMF0.65CS. The HR material after being appropriately cut with the solvent has a viscosity less than 1100 centipois (cP) at room temperature and in this example has a viscosity of 1000 cP at room temperature. In one example, the jetting equipment used to jet the HR material is an Asymtek X1020 jetting machine available from Hordson Asmtek of 2747 Loker Avenue West, Carlsbad, Calif. 92010. The jetting machine has two jet heads. The first jet head is used to apply HR material with a first viscosity, whereas the second jet head is used to apply HR material with a second viscosity.

Figure 19:
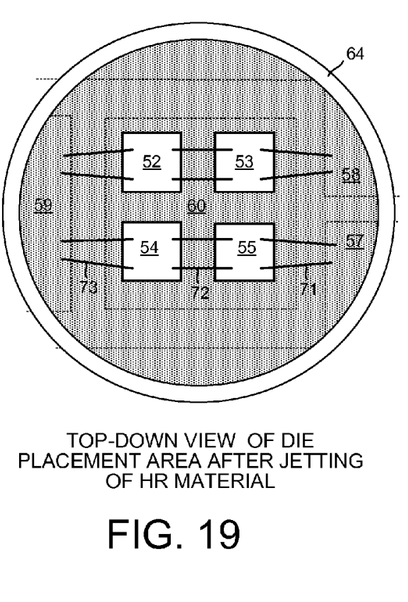
FIG. 19 is a simplified top-down diagram of the die placement area after the jetting of the HR material has been completed.

FIG. 19 shows the result of the step of depositing the HR material. Layer 74 of HR material covers substantially all the area within the confines of the retaining ring 64 other than the top surfaces of LED dice 52-55. Layer 74 coats the upper surface of the substrate underneath the bridging bond wires. Whereas in the prior art example of FIG. 9 there exists a peripheral strip of the substrate around each LED die that is not covered with HR material, in the structure illustrated in FIG. 19 there is no such uncovered peripheral strip. Whereas in the prior art example of FIG. 9 there are uncovered areas of the substrate in the areas where wire bonds attach to the substrate, in the structure illustrated in FIG. 19 there are no such uncovered areas. The HR material is made to coat the upper surface of the substrate right up location where the wire bond makes contact with the substrate. The HR material is also made to coat the upper surface of the substrate right up to the side edges of the LED dice. The HR material is made to coat the upper surface of the substrate right up to the inside side edge of the retaining ring 64.

Figure 20:
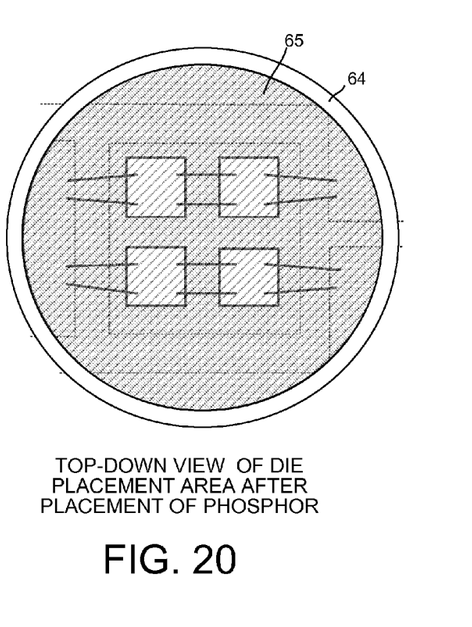
FIG. 20 is a simplified top-down diagram of the die placement area after phosphor has been placed over the LED dice within the confines of the retaining ring.

FIG. 20 shows the result of the next step in the method. Phosphor 65 is deposited into the circular area bounded by the retaining ring 64 so that the phosphor 65 covers the LED dice as illustrated in FIG. 12. The phosphor is then allowed to cure and harden. Once the phosphor 65 has been deposited, the panel of MCPCBs is singulated, thereby forming a plurality of LED assemblies. The LED assembly structure 50 illustrated in FIG. 11 is one of these LED assemblies.

The method set forth above in connection with FIGS. 11-20 has several advantageous aspects in comparison with the prior art method set forth above in connection with FIGS. 1-10. First, the amount of the upper surface of the substrate that is left uncovered by HR material is reduced in comparison with the prior art screen printing method. Parts of the substrate that are not covered by HR material may and typically do absorb light or otherwise do not reflect light well, thereby reducing the light efficiency of the LED assembly. By covering more of the surface of the substrate with HR material using the jetting process, more light is reflected from the LED assembly and the light efficiency of the LED assembly is increased. In the prior art screen printing process used to deposit HR material, variations in physical sizes and imperfections in die attach and wire bonding processes required the windows in the HR layer to be so large that after die attach and wire bonding substantial areas of exposed substrate remained uncovered by HR material. In the jetting process, the HR material is applied after die placement and wire bonding, and machine vision and control techniques are used to control the jetting process so that the substrate is coated up to the edges of structures (the LED dice and the retaining ring) even if the structures are in slightly different places, from one assembly to the next. The use of laterally flowing HR material reduces the need to account for differences in die placement and wire bond locations from assembly to assembly. The HR material naturally flows laterally up to the proper structures even if the structures are not always disposed in the same location from assembly to assembly.

Second, the HR layer is deposited after the sensitive die attach and wire bonding process steps. In the prior art screen printing method of depositing HR material, on the other hand, the HR material is screen printed onto the substrate prior to die attach and wire bonding. The HR material is an organic material. If die attach and wire bonding are performed when organic residue is present on the substrate, then errors in die attach and wire bonding can occur and such error reduce LED assembly manufacturing yield. Accordingly, plasma cleaning is often conventionally done after the HR screen printing step in an attempt to remove all such organic residue prior to die attach and wire bonding. This plasma cleaning is, however, difficult to perform as compared to performing die attach on a plasma cleaned surface that has never been exposed to organics. Accordingly, defects due to performing die attach and wire bonding on surfaces having organic residues are reduced or eliminated using the jetting process.

Third, the jetted HR layer can be made to coat surfaces with relatively large steps and with different levels and sloped surfaces. In the prior art screen printing method, on the other hand, the surfaces to which the HR material is being applied must be more planar. In one example of the novel jetting process, a first HR material with less viscosity is applied to certain areas of the substrate that are relatively flat and planar so that the HR material will flow under wire bonds and will flow up to the edges of dice, whereas a second HR material with more viscosity is applied to other portions of the surface of the substrate that are more inclined or more stepped. The first HR material is applied with a first jet head of the jetting machine, whereas the second HR material is applied with a second jet head of the jetting machine.

Fourth, the production rate of LED assemblies is increased by not coating certain parts of the substrate with HR material in certain situations. In some examples, the area of the substrate between LED dice is small. It has been found that the benefit of coating this small inter-dice area is only slight. Accordingly, the HR material is not jetted into the inter-dice areas in order to save manufacturing time.

Fifth, it is generally desirable to be able to place fiducial markers on the substrate surface and to have the imaging systems of the die attach and wire bonding equipment use these fiducial markers during die attach and wire bonding processing. In the prior art screen printing process where the HR layer has been deposited prior to die attach and wire bonding, there is limited exposed substrate area available for placement of appropriate fiducial markers. Most of the upper surface of the substrate has been covered by HR material. In the novel jetting method of applying HR material, on the other hand, die attach and wire bonding occur prior to the depositing of the HR layer. Accordingly, fiducial markers (for example, 60A-60D) that will later be covered over by HR material are nevertheless usable at die attach and wire bonding time by die attach and wire bonding imaging systems.

Figure 21:
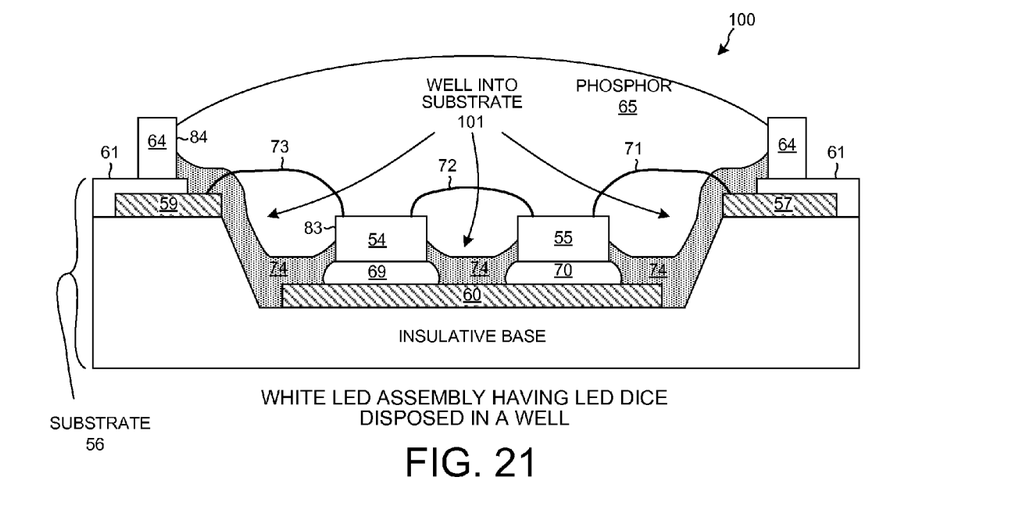
FIG. 21 is a simplified cross-sectional diagram of a white LED assembly where the LED dice are disposed in a well.

The deposition of an HR layer using jetting is not limited to the particular LED assembly set forth FIGS. 12. FIG. 21 is a diagram of another type of LED assembly 100. In the diagrams of FIG. 21 and FIG. 12, the same reference numerals are used to denote the same or similar structures. In the LED assembly of FIG. 21, the substrate 56 forms a well 101. The upper surface of the substrate has a nonplanar shape. The four LED dice 52-55 are mounted to metal pad 60 at the bottom of the well 101 as illustrated. Jetting is used to coat the sidewalls of this well with HR material. In the specific example illustrated, substantially all of the upper surface of the substrate within the circular confines of retaining ring 64 but for the LED dice 52-55 is coated with HR material. The liquid HR material that is painted onto the sidewalls of the well can be a liquid HR material with a relatively higher viscosity as compared with the viscosity of the liquid HR material that is painted onto the remainder of the surface of the substrate. The resulting HR layer is conformal to the nonplanar upper surface of the substrate over the various edges and sloping surfaces of the substrate.

Figure 22:
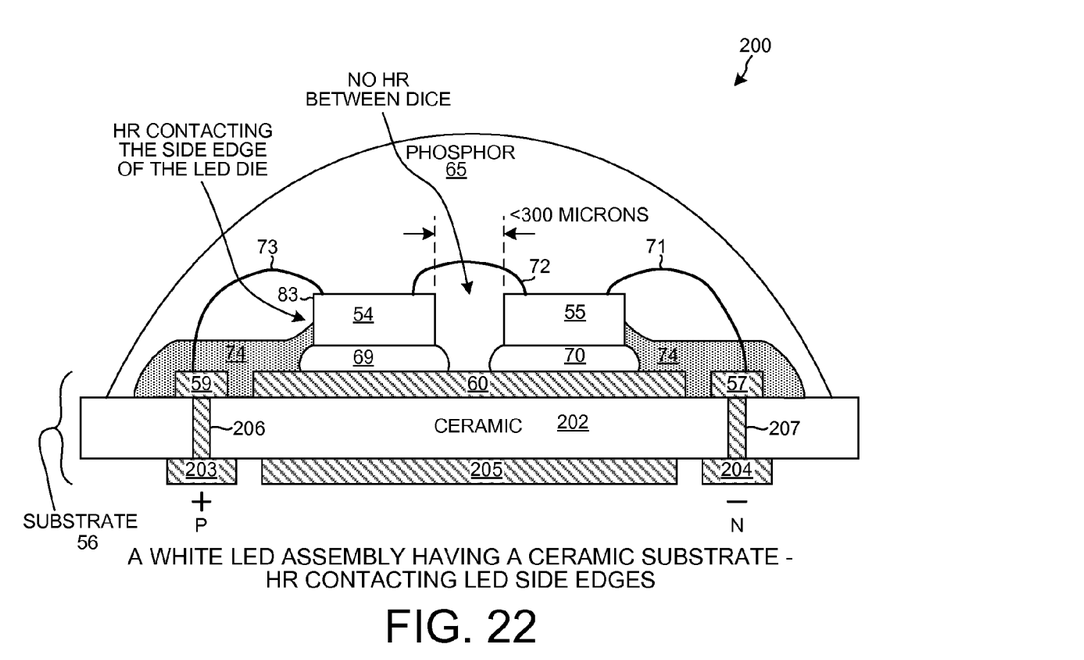
FIG. 22 is a simplified cross-sectional diagram of a white LED assembly having a ceramic substrate.

FIG. 22 is a diagram of another type of LED assembly 200. The substrate 56 in this case includes a ceramic portion 202. A first electrode 203 (P+ electrode), a second electrode 204 (N− electrode), and a thermal pad 205 of metal are disposed on the bottom surface of the ceramic portion 202. A conductive via 206 couples the P+ electrode 203 to metal portion 59 on the upper surface of the ceramic portion 202. Similarly, a conductive via 207 couples the N− electrode 204 to metal portion 57 on the upper surface of the ceramic portion 202. The thickness of the metal layers on the top and bottom of the substrate may be large, such as 81 microns, and this large thickness makes screen printing the HR material difficult. The HR layer 74 contacts substantially all of at least one side edge of each LED die as pictured. In the illustrated example, the surface area of the substrate 56 between LED dice 52-55 is not covered with HR material as described above in order to reduce production times. The inter-dice distance between the LED dice 52-55 is less than 300 microns and the inter-dice area is not jetted with HR material. In other examples, this inter-dice area is coated with HR material. In an example where a retaining ring is provided (not shown), the HR layer 74 may or may not extend outward all the way to the retaining ring. The HR layer 74 may contact the inside side edge of such a retaining ring, or may stop short of the retaining ring such that the HR layer 74 does not touch the inside side edge of the retaining ring.

Figure 23:
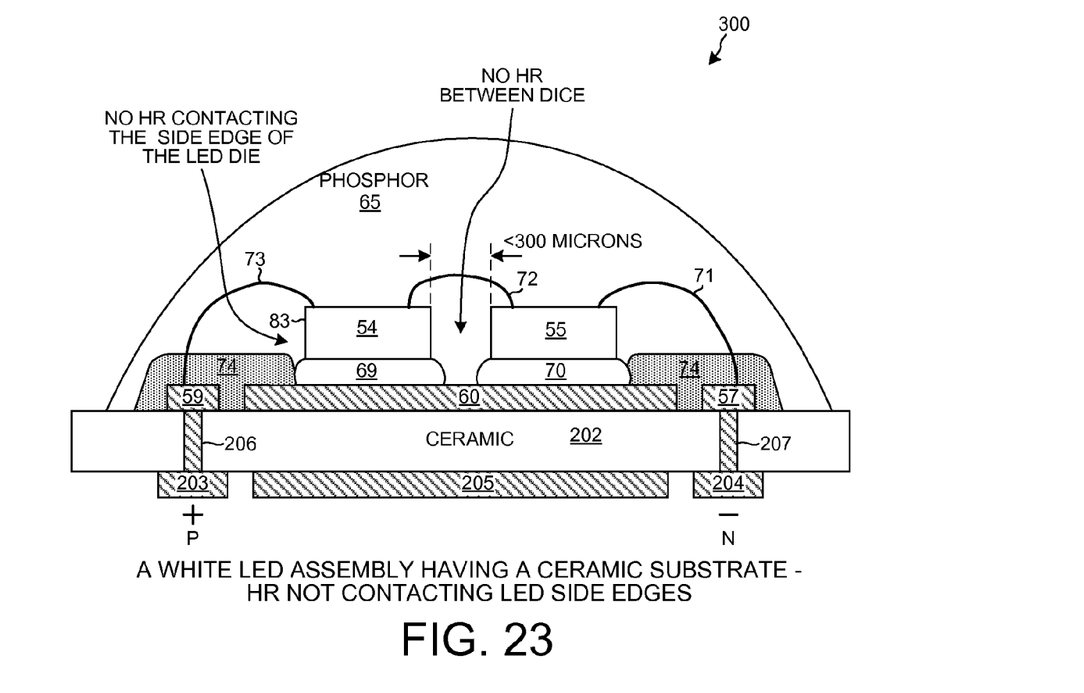
FIG. 23 is a simplified cross-sectional diagram of a white LED assembly having a ceramic substrate, where the HR material does not touch a side edge of any of the LED dice, and is not disposed between the LED dice.

FIG. 23 is a diagram of an LED assembly 300 where the substrate 56 involves a ceramic portion 202 as in FIG. 22, but the HR layer 74 does not contact a side edge of any of the LED dice 52-55. The HR layer 74 is deposited to stop short of the LED dice so that the HR layer 74 does not contact any side edge of any LED die. In the final assembly, the LED dice appear disposed in a central window in the HR layer 74. As compared the screen printing conventional method of applying HR material, however, the amount of exposed substrate (substrate under the phosphor 65 that is not covered by either an LED die or HR material) is much reduced in the structures of both FIG. 22 and FIG. 23.

Figure 24:
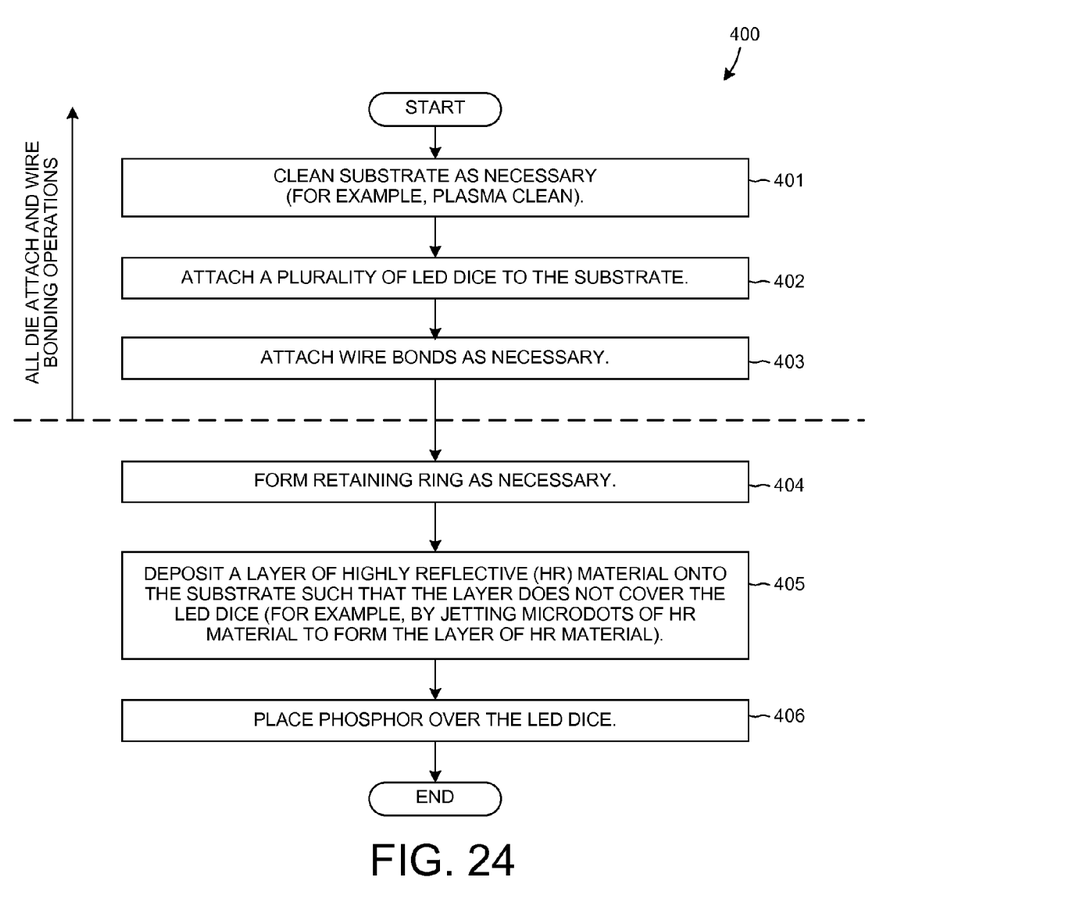
FIG. 24 is a flowchart of a method in accordance with a novel aspect. In a first novel aspect, an HR layer is deposited onto the substrate of an LED assembly after die attach and after wire bonding. In a second novel aspect, an HR layer is deposited by jetting microdots of HR material onto a substrate of the LED assembly.

FIG. 24 is a flowchart of a method 400. Initially, a substrate is cleaned (step 401) as necessary. In one example, the substrate 56 is part of the panel 75 of FIG. 13. Panel 75 is plasma cleaned to remove any organic materials from its surface. Next (step 402), a plurality of LED dice is attached to the substrate. In one example, the LED dice are the dice 52-55 that are attached using silver epoxy to the substrate 56. FIG. 15 shows the result of this die attach step. Next (step 403), wire bonding is performed as necessary. In some cases, wire bonding is not used and the die is electrically connected to the substrate without wire bonding. In an example where wire bonding is performed, the result of the wire bonding step is as shown in FIG. 16. Next (step 404), a retaining ring is formed around the LED dice as necessary. In one example where a retaining ring 64 is used, the result of the step of forming the retaining ring is as illustrated in FIG. 17. Next (step 405), a layer of an HR material is deposited onto the substrate 56 such that the HR material does not cover the LED dice. FIG. 18 shows one example of how this HR material might be deposited in a jetting process. The HR material is jetted onto exposed portions of the upper surface of the substrate around the dice 52-55, and the liquid HR material is allowed to cure and harden. Next (step 406), an amount of liquid phosphor (actually silicone bearing phosphor particles) is placed over the LED dice and allowed to cure. In one example, the result of this step is illustrated in FIG. 20. The resulting panel of LED assemblies is then singulated to form a plurality of separate LED assemblies. In one example, FIG. 11 is a top-down diagram of one of these separate LED assemblies. In a first novel aspect, the HR layer of the LED assembly is deposited after the die attach step and after the wire bonding step in the LED assembly process. In a second novel aspect, the HR layer of an LED assembly is deposited by jetting microdots of liquid HR material onto a substrate of the LED assembly.

Although certain specific embodiments are described above for instructional purposes, the teachings of this patent document have general applicability and are not limited to the specific embodiments described above. The material being jetted need not be HR material. In some examples, different types of HR material are jetted onto different parts of the LED assembly. Accordingly, various modifications, adaptations, and combinations of various features of the described embodiments can be practiced without departing from the scope of the invention as set forth in the claims.

What is claimed is:

1. A method comprising:
attaching a plurality of Light Emitting Diode (LED) dice to a substrate; and
depositing a layer of a Highly Reflective (HR) material onto the substrate such that the layer does not cover the LED dice, wherein the depositing occurs after the attaching of the LED dice, and wherein the depositing of the layer of HR material involves jetting microdots of the HR material.

2. The method of claim 1, wherein the layer of HR material comprises titanium dioxide and silicone, and wherein the layer of HR material does not extend under the LED dice between the LED dice and the substrate.

3. The method of claim 1, further comprising:
attaching wire bonds to the LED dice, wherein the attaching of the wire bonds occurs before the depositing of the layer of HR material.

4. The method of claim 3, wherein the layer of HR material extends under the wire bonds, and wherein the layer of HR material contacts the wire bonds.

5. A method comprising:
depositing a layer of a Highly Reflective (HR) material onto a substrate by jetting a plurality of microdots of the HR material onto the substrate.

6. The method of claim 5, wherein a Light Emitting Diode (LED) die is disposed on the substrate at a time when the microdots are jetted onto the substrate.

7. The method of claim 6, wherein a bond wire is disposed in contact with the LED die at the time when the microdots are jetted onto the substrate.

8. The method of claim 7, wherein the layer of HR material extends under the bond wire.

9. The method of claim 7, wherein after being jetted onto the substrate the HR material flows laterally across a surface of the substrate and thereby flows under the bond wire.

10. The method of claim 6, wherein the layer of HR material forms a substantially planar layer, wherein there is a window in the substantially planar layer, and wherein the LED die is disposed in the window.

11. The method of claim 10, wherein the layer of HR material does not extend over the LED die, and wherein the layer of HR material does not extend under the LED die.

12. The method of claim 6, wherein the layer of HR material contacts the LED die.

13. The method of claim 6, wherein the LED die has a plurality of side edges, and wherein the layer of HR material contacts at least one of the side edges.

14. The method of claim 6, wherein the substrate has a surface that forms a well, wherein the LED die is disposed in the well, and wherein at least a portion of the layer of HR material is disposed in the well.

15. The method of claim 5, wherein the layer of HR material has a reflectivity of at least 85 percent.

16. The method of claim 5, wherein the layer of HR material is at least 10 microns thick.

17. The method of claim 5, wherein the HR material includes titanium.

18. The method of claim 5, wherein each of the microdots is less than 100 microns in diameter.

19. The method of claim 5, wherein the substrate is a panel of printed circuit boards, and wherein a plurality of Light Emitting Diode (LED) dice is disposed on the substrate.

* * * * *